US008638584B2

(12) United States Patent
Chevallier et al.

(10) Patent No.: US 8,638,584 B2
(45) Date of Patent: Jan. 28, 2014

(54) MEMORY ARCHITECTURES AND TECHNIQUES TO ENHANCE THROUGHPUT FOR CROSS-POINT ARRAYS

(75) Inventors: Christophe Chevallier, Palo Alto, CA (US); Sri Rama Namala, San Jose, CA (US); Chang Hua Siau, San Jose, CA (US); David Eggleston, San Jose, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 264 days.

(21) Appl. No.: 12/658,138

(22) Filed: Feb. 2, 2010

(65) Prior Publication Data
US 2011/0188282 A1 Aug. 4, 2011

(51) Int. Cl.
*G11C 8/02* (2006.01)
(52) U.S. Cl.
USPC .... 365/51; 365/148; 365/230.03; 365/230.06
(58) Field of Classification Search
USPC .......................... 365/51, 148, 230.03, 230.06
See application file for complete search history.

(56) References Cited

U.S. PATENT DOCUMENTS

| | | | |
|---|---|---|---|
| 5,483,482 A | 1/1996 | Yamada et al. | |
| 5,835,396 A * | 11/1998 | Zhang | 365/51 |
| 5,991,193 A | 11/1999 | Gallagher et al. | |
| 6,034,882 A | 3/2000 | Johnson et al. | |
| 6,128,214 A | 10/2000 | Kuekes et al. | |
| 6,185,121 B1 * | 2/2001 | O'Neill | 365/94 |
| 6,185,122 B1 | 2/2001 | Johnson et al. | |
| 6,204,139 B1 | 3/2001 | Liu et al. | |
| 6,351,406 B1 | 2/2002 | Johnson et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,459,095 B1 | 10/2002 | Heath et al. | |
| 6,473,332 B1 | 10/2002 | Ignatiev et al. | |
| 6,504,753 B1 | 1/2003 | Scheuerlein et al. | |
| 6,515,888 B2 | 2/2003 | Johnson et al. | |
| 6,515,904 B2 | 2/2003 | Moore et al. | |
| 6,522,594 B1 | 2/2003 | Scheuerlein | |
| 6,525,953 B1 | 2/2003 | Johnson | |
| 6,534,403 B2 | 3/2003 | Cleeves | |
| 6,545,891 B1 | 4/2003 | Tringali et al. | |
| 6,569,745 B2 | 5/2003 | Hsu | |

(Continued)

OTHER PUBLICATIONS

U.S. Appl. No. 12/931,422, filed Jan. 31, 2011, Chevallier et al.

(Continued)

*Primary Examiner* — Hoai V Ho
(74) *Attorney, Agent, or Firm* — Stolowitz Ford Cowger LLP

(57) ABSTRACT

Embodiments of the invention relate generally to semiconductors and memory technology, and more particularly, to systems, integrated circuits, and methods to implement memory architectures configured to enhance throughput for cross point arrays including memory elements, such as memory elements based on third dimensional memory technology. In at least some embodiments, an integrated circuit includes arrays that include memory elements being formed BEOL above a FEOL logic layer within a boundary in a plane parallel to a substrate, and array lines. Further, the integrated circuit includes array line decoders disposed in the logic layer within a region located coextensive with the boundary and between the substrate and the arrays. In some embodiments, the disposition of peripheral circuitry, such as the array line decoders, under the arrays can preserve or optimize die efficiency for throughput enhancement.

26 Claims, 9 Drawing Sheets

(56) References Cited

U.S. PATENT DOCUMENTS

| | | | |
|---|---|---|---|
| 6,599,796 B2 | 7/2003 | Mei et al. |
| 6,631,085 B2 | 10/2003 | Kleveland et al. |
| 6,642,539 B2 | 11/2003 | Ramesh et al. |
| 6,693,821 B2 | 2/2004 | Hsu et al. |
| 6,759,249 B2 | 7/2004 | Zhuang et al. |
| 6,777,248 B1 | 8/2004 | Nabatame et al. |
| 6,816,410 B2 | 11/2004 | Kleveland et al. |
| 6,822,903 B2 | 11/2004 | Scheuerlein et al. |
| 6,836,421 B2 | 12/2004 | Rinerson et al. |
| 6,850,455 B2 | 2/2005 | Rinerson et al. |
| 6,859,382 B2 | 2/2005 | Rinerson et al. |
| 6,882,553 B2 | 4/2005 | Nejad et al. |
| 6,903,361 B2 | 6/2005 | Gilton |
| 6,917,539 B2 | 7/2005 | Rinerson et al. |
| 6,927,430 B2 | 8/2005 | Hsu |
| 6,940,113 B2 | 9/2005 | Hsu et al. |
| 6,940,744 B2 | 9/2005 | Rinerson et al. |
| 6,970,375 B2 | 11/2005 | Rinerson et al. |
| 7,001,846 B2 | 2/2006 | Hsu |
| 7,009,909 B2 | 3/2006 | Rinerson et al. |
| 7,020,006 B2 | 3/2006 | Chevallier et al. |
| 7,022,572 B2 | 4/2006 | Scheuerlein et al. |
| 7,023,743 B2 | 4/2006 | Nejad et al. |
| 7,046,550 B1 | 5/2006 | Reohr et al. |
| 7,057,914 B2 | 6/2006 | Rinerson et al. |
| 7,079,442 B2 | 7/2006 | Rinerson et al. |
| 7,141,481 B2 | 11/2006 | Hsu et al. |
| 7,177,181 B1 | 2/2007 | Scheuerlein |
| 7,256,415 B2 | 8/2007 | Furukawa et al. |
| 7,292,957 B1* | 11/2007 | Schell ................ 702/182 |
| 7,326,979 B2 | 2/2008 | Rinerson et al. |
| 7,339,811 B2 | 3/2008 | Nejad et al. |
| 7,372,753 B1 | 5/2008 | Rinerson et al. |
| 7,379,364 B2 | 5/2008 | Siau et al. |
| 7,394,680 B2 | 7/2008 | Toda et al. |
| 7,405,960 B2 | 7/2008 | Cho et al. |
| 7,417,271 B2 | 8/2008 | Genrikh et al. |
| 7,443,711 B1 | 10/2008 | Stewart et al. |
| 7,463,546 B2 | 12/2008 | Fasoli et al. |
| 7,498,600 B2 | 3/2009 | Cho et al. |
| 7,505,344 B2 | 3/2009 | Scheuerlein |
| 7,508,695 B2 | 3/2009 | Sugita |
| 7,538,338 B2 | 5/2009 | Rinerson et al. |
| 7,554,873 B2 | 6/2009 | Lee et al. |
| 7,608,467 B2 | 10/2009 | Wu et al. |
| 7,639,521 B2 | 12/2009 | Baek et al. |
| 7,643,344 B2 | 1/2010 | Choi |
| 7,701,791 B2 | 4/2010 | Rinerson et al. |
| 7,706,177 B2 | 4/2010 | Petti |
| 7,719,876 B2 | 5/2010 | Chevallier et al. |
| 7,733,685 B2 | 6/2010 | Scheuerlein et al. |
| 7,742,323 B2 | 6/2010 | Rinerson et al. |
| 7,782,650 B2 | 8/2010 | Bertin et al. |
| 7,842,991 B2 | 11/2010 | Cho et al. |
| 7,884,349 B2 | 2/2011 | Rinerson et al. |
| 7,898,841 B2 | 3/2011 | Chevallier et al. |
| 7,902,867 B2 | 3/2011 | Mouttet |
| 7,902,868 B2 | 3/2011 | Norman |
| 7,902,869 B1 | 3/2011 | Carter |
| 7,924,608 B2 | 4/2011 | Campbell |
| 7,929,345 B2 | 4/2011 | Issaq |
| 7,955,871 B2 | 6/2011 | Wu et al. |
| 7,961,494 B2 | 6/2011 | Scheuerlein |
| 7,985,963 B2 | 7/2011 | Rinerson et al. |
| 2001/0055838 A1 | 12/2001 | Walker et al. |
| 2001/0297927 | 12/2001 | Ramaswamy et al. |
| 2003/0003675 A1 | 1/2003 | Hsu |
| 2004/0109353 A1 | 6/2004 | Matsuoka |
| 2004/0170040 A1 | 9/2004 | Rinerson et al. |
| 2006/0050598 A1* | 3/2006 | Rinerson et al. ............ 365/232 |
| 2006/0054937 A1 | 3/2006 | Lucovsky et al. |
| 2006/0131695 A1 | 6/2006 | Kuekes et al. |
| 2006/0171200 A1 | 8/2006 | Rinerson et al. |
| 2007/0253245 A1* | 11/2007 | Ranjan et al. ............ 365/171 |
| 2008/0068875 A1 | 3/2008 | Choi |
| 2008/0090401 A1 | 4/2008 | Bratkovski et al. |
| 2008/0157127 A1 | 7/2008 | Bertin et al. |
| 2008/0278989 A1 | 11/2008 | Lee et al. |
| 2009/0027976 A1 | 1/2009 | Brewer et al. |
| 2009/0154232 A1 | 6/2009 | Norman |
| 2009/0225582 A1 | 9/2009 | Schloss |
| 2009/0302315 A1 | 12/2009 | Lee et al. |
| 2010/0044666 A1 | 2/2010 | Baek et al. |
| 2010/0067279 A1 | 3/2010 | Choi |
| 2010/0073990 A1 | 3/2010 | Siau et al. |
| 2010/0078759 A1 | 4/2010 | Sekar et al. |
| 2010/0110771 A1 | 5/2010 | Choi |
| 2010/0134239 A1 | 6/2010 | Wu et al. |
| 2010/0155686 A1 | 6/2010 | Bratkovski et al. |
| 2010/0155722 A1 | 6/2010 | Meyer |
| 2010/0157658 A1 | 6/2010 | Schloss et al. |
| 2010/0159641 A1 | 6/2010 | Rinerson et al. |
| 2010/0159688 A1 | 6/2010 | Rinerson et al. |
| 2010/0161888 A1 | 6/2010 | Eggleston |
| 2010/0161918 A1* | 6/2010 | Norman .................. 711/158 |
| 2010/0195393 A1 | 8/2010 | Eggleston |
| 2010/0202188 A1 | 8/2010 | Rinerson et al. |
| 2010/0271885 A1 | 10/2010 | Scheuerlein et al. |
| 2010/0278479 A1 | 11/2010 | Bratkovski et al. |
| 2010/0290294 A1 | 11/2010 | Siau |
| 2011/0006275 A1 | 1/2011 | Roelofs et al. |
| 2011/0017977 A1 | 1/2011 | Bratkovski et al. |
| 2011/0024710 A1 | 2/2011 | Bratkovski et al. |
| 2011/0024716 A1 | 2/2011 | Bratkovski et al. |
| 2011/0059576 A1 | 3/2011 | Cho et al. |
| 2011/0182103 A1 | 7/2011 | Smythe et al. |
| 2011/0297927 A1 | 12/2011 | Ramaswamy et al. |

OTHER PUBLICATIONS

U.S. Appl. No. 12/931,438, filed Feb. 1, 2011, Chevallier et al.
U.S. Appl. No. 12/657,895, filed Jan. 29, 2010, Chevallier et al.
U.S. Appl. No. 12/657,911, filed Jan. 29, 2010, Chang Hua Siau.
U.S. Appl. No. 12/658,138, filed Feb. 2, 2010, Chevallier et al.
U.S. Appl. No. 13/134,579, filed Jun. 10, 2011, Chang Hua Siau et al.
U.S. Appl. No. 13/185,410, filed Jul. 18, 2011, Besser et al.
U.S. Appl. No. 13/210,292, filed Aug. 15, 2011, Bruce Bateman.
U.S. Appl. No. 13/250,923, filed Sep. 30, 2011, Jian Wu et al.
U.S. Appl. No. 13/250,772, filed Sep. 30. 2011, Louis Parillo et al.
Elaine Ou et al., "Array Architecture for a Nonvolatile 3-Dimensional Cross-Point Resistance-Change Memory", IEEE Journal of Solid-State Circuits, vol. 46, No. 9, Sep. 2011, pp. 2158-2170.
Elaine Ou et al., "Array Architecture for a Nonvolatile 3-Dimensional Cross-Point Memory", Doctoral Dissertation, Stanford University, Mar. 2010, pp. 1-19.
Leon Abelmann et al., "Self-assembled three-dimensional non-volatile memories", Micromachines 2010, vol. 1, pp. 1-18, Jan. 18, 2010.
Ju. H. Krieger, "Principle Operation of 3-D Memory Device based on Piezoacousto Properties of Ferroelectric Films", InTech, Dec. 2010, pp. 3-16.
Ji Zhang et al., "A 3D RRAM Using Stackable 1TXR Memory Cell for High Density Application", IEEE Xplore, Feb. 5, 2010, pp. 917-920.
Yajie Dong et al., "Si/a-Si Core/Shell Nanowires as Nonvolatile Crossbar Switches", Nano Letters 2008, vol. 8, No. 2 , pp. 386-391.
R Stanley Williams et al., "The switching location of a bipolar memristor: chemical, thermal and structural mapping", Nanotechnology 22 (2011) 254015, pp. 1-6.
D. L. Kwong et al., "Vertical Silicon Nanowire Platformfor Low Power Electronics and Clean Energy Applications", Journal of Nanotechnology, vol. 2012, Article ID 492121, pp. 1-21.
Jiyoung Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, pp. 186-187.
Ryota Katsumata et al., "Pipe-shaped BiCS Flash Memory with 16 Stacked Layers and Multi-Level-Cell Operation for Ultra High Den-

(56) References Cited

OTHER PUBLICATIONS sity Storage Devices", 2009 Symposium on VLSI Technology Digest of Technical Papers, pp. 136-137.
Christophe J. Chevallier et al., "A 0.13μm 64Mb Multi-Layered Conductive Metal-Oxide Memory" ISSCC 2010 / Session 14 / Non-Volatile Memory / 14.3, pp. 260-261.
Hong Sik Yoon et al., "Vertical Cross-point Resistance Change Memory for Ultra-High Density Non-volatile Memory Applications", 2009 Symposium on VLSI Technology Digest of Technical Papers, pp. 26-27.
Wonjoo Kim et al., "Multi-Layered Vertical Gate NAND Flash Overcoming Stacking Limit for Terabit Density Storage", 2009 Symposium on VLSI Technology Digest of Technical Papers, pp. 188-189.
I. G. Baek et al., "Realization of Vertical Resistive Memory (VRRAM) using cost effective 3D Process", IDEM 2011, 31.8.1, pp. 73-740.
Hang-Ting Lue et al., "A Highly Scalable 8-Layer 3D Vertical-Gate (VG) TFT NAND Flash Using Junction-Free Buried Channel BE-SONOS Device", IEEE 2010 Symposium on VLSI Technology Digest of Technical Papers, pp. 131-132.
Jaehoon Jang et al., "Vertical Cell Array using TCAT(Terabit Cell Array Transistor) Technology for Ultra High Density NAND Flash Memory", 2009 Symposium on VLSI Technology Digest of Technical Papers, pp. 192-193.
U.S. Appl. No. 12/653,854, filed Dec. 18, 2009, Bornstein et al.
U.S. Appl. No. 12/653,835, filed Dec. 18, 2009, Meyer.
U.S. Appl. No. 13/210,342, filed Aug. 15, 2011, Brewer et al.

\* cited by examiner

MEMORY ARCHITECTURES AND TECHNIQUES TO ENHANCE THROUGHPUT FOR CROSS-POINT ARRAYS

CROSS-REFERENCE TO RELATED APPLICATIONS

This application is related to U.S. patent application Ser. No. 11/095,026, filed Mar. 30, 2005, published as U.S. Pub. No. 2006/0171200, and entitled "Memory Using Mixed Valence Conductive Oxides," to U.S. patent application Ser. No. 11/881,500, filed Jul. 26, 2007, issued as U.S. Pat. No. 7,701,791, and entitled "Low Read Current Architecture for Memory," and to U.S. patent application Ser. No. 12/657,911, filed Jan. 29, 2010, issued as U.S. Pat. No. 8,270,193, and entitled "Local Bit Lines and Methods of Selecting the Same to Access Memory Elements in Cross-Point Arrays," all of which are incorporated herein by reference.

FIELD OF THE INVENTION

Embodiments of the invention relate generally to semiconductors and memory technology, and more particularly, to systems, integrated circuits, and methods to implement memory architectures configured to enhance throughput for cross point arrays including memory elements, such as memory elements based on third dimensional memory technology.

BACKGROUND

Conventional memory architectures, such as those suitable for mass storage applications, usually require data to be written and read in block-wise sizes. Examples of typical block-wise sizes include bit capacities ranging from values in the hundreds of bits to values in the thousands of bits for a write or read operation. One characteristic of interest for some memory architectures is "throughput," which describes a rate at which amounts of data are communicated during either read or write operations in association with memory arrays. In some cases, increasing throughput for traditional memory devices may necessitate increases in memory-support circuitry. In turn, an increased amount of memory-support circuitry usually consumes additional resources that contribute to increases in die size. To illustrate, consider that added decoder circuitry for purposes of increasing throughput in conventional memory architectures generally increases the surface area consumed by the decoder circuitry. While conventional memory architectures are functional, traditional approaches to increasing throughput are not well-suited to enhance throughput independently relative to the size of the die.

FIG. 1 depicts a memory device implementing a conventional memory architecture. Typical memory devices include two to four relatively large arrays that are usually formed in a semiconductor surface and share a plane common with memory-support circuitry, such as decoder circuitry. Diagram 100 depicts a memory device 102 implementing a NAND-based conventional memory architecture having two arrays (i.e., array 110a and array 110b). An example of memory device 102 is a NAND-based Flash memory device. Memory device 102 also includes decoder 112a and decoder 112b to provide a group of data 114a and a group of data 114b, respectively, at a particular throughput either collectively or individually. An example of a value of throughput is approximately 5 megabytes per second. The dimensions of the die upon which memory device 102 is formed establish a planar surface area 152, as shown in diagram 150. As shown, arrays 110a and 110b both are formed in a first area 106a, and decoders 112a and 112b both are formed in a second area 106b, whereby areas 106a and 106b are separate areas or portions of planar surface area 152 that are formed in a common plane. Normally, the die size (i.e., planar surface area 152) for memory device 102 varies dependently on sizes and/or quantities of decoders 112a and 112b. Thus, increases in area 106b normally affect the die size, thereby detrimentally affecting the die efficiency for memory device 102.

There are continuing efforts to improve memory architectures and throughput of memory architectures.

BRIEF DESCRIPTION OF THE DRAWINGS

The various embodiments are more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION

Figure 1:
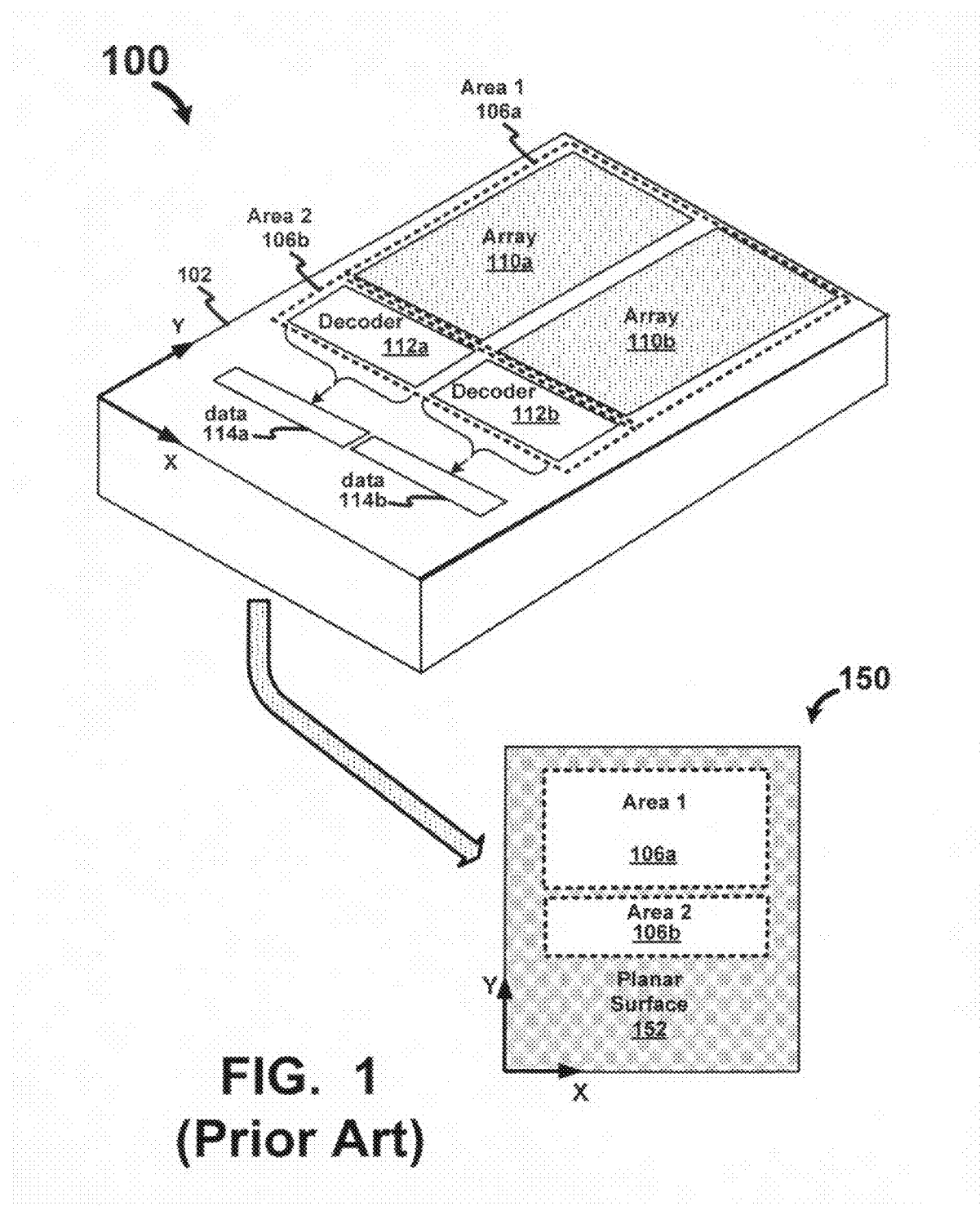
FIG. 1 depicts a memory device implementing a conventional memory architecture.

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments. FIG. 5A is a block diagram representing the basic components of one embodiment of a memory element 560, FIG. 5B is a block diagram of the memory element 560 in a two-terminal memory cell, and FIG. 5C is a block diagram of the memory element embodiment of FIG. 5A in a three-terminal memory cell. FIG. 5A shows an electrolytic tunnel barrier 565 and an on reservoir 570, two basic components of the memory element 560. FIG. 5B shows the memory element 560 between a top memory electrode 575 and a bottom memory electrode 580. The orientation of the memory element (i.e., whether the electrolytic tunnel barrier 565 is near the top memory electrode 575 or the bottom memory electrode 580) may be important for processing considerations, including the necessity of seed layers and how the tunnel barrier reacts with the ion reservoir 570 during deposition. FIG. 5C shows the memory element 560 oriented with the electrolytic tunnel barrier 565 on the bottom in a three-terminal transistor device, having a source memory element electrode 585, gate memory element electrode 587 and a drain memory element electrode 589. In such an orientation, the electrolytic tunnel barrier 565 could also function as a gate oxide. Referring back to FIG. 5A, the electrolytic tunnel barrier 565 will typically be between 10 and less than 50 angstroms. If the electrolytic tunnel barrier 565 is much greater than 50 angstroms, then the voltage that is required to create the electric field necessary to move electrons through the memory element 560 via tunneling becomes too high for most electronic devices. Depending on the electrolytic tunnel barrier 565 material, a preferred electrolytic tunnel barrier 565 width might be between 15 and 40 angstroms for circuits where rapid access times (on the order of tens of nanoseconds, typically below 100 ns) in small dimension devices (on the order of hundreds of nanometers) are desired. Fundamentally, the electrolytic tunnel barrier 565 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium. The electrolytic tunnel barrier 565 will typically be of very high quality, being as uniform as possible to allow for predictability in the voltage required to obtain a current through the memory element 560. Although atomic layer deposition and plasma oxidation are examples of methods that can be used to create very high quality tunnel barriers, the parameters of a particular system will dictate its fabrication options. Although tunnel barriers can be obtained by allowing a reactive metal to simply come in contact with an ion reservoir 570, as described in PCT Patent Application No. PCT/US04/13836, filed May 3, 2004, already incorporated herein by reference, such barriers may be lacking in uniformity, which may be important in some embodiments. Accordingly, in a preferred embodiment of the invention the tunnel barrier does not significantly react with the ion reservoir 570 during fabrication. With standard designs, the electric field at the tunnel barrier 565 is typically high enough to promote tunneling at thicknesses between 10 and 50 angstroms. The electric field is typically higher than at other points in the memory element 560 because of the relatively high serial electronic resistance of the electrolytic tunnel barrier 565. The high electric field of the electrolytic tunnel barrier 565 also penetrates into the ion reservoir 570 at least one Debye length. The Debye length can be defined as the distance which a local electric field affects distribution of free charge carriers. At an appropriate polarity, the electric field within the ion reservoir 570 causes ions (which can be positively or negatively charged) to move from the ion reservoir 570 through the electrolytic tunnel barrier 565, which is an ionic electrolyte. The on reservoir 570 is a material that is conductive enough to allow current to flow and has mobile ions. The ion reservoir 570 can be, for example, an oxygen reservoir with mobile oxygen ions. Oxygen ions are negative in charge, and will flow in the direction opposite of current.

In some embodiments, an electrolytic tunnel barrier and one or more mixed valence conductive oxide structures do not need to operate in a silicon substrate, and, therefore, can be fabricated above circuitry being used for other purposes. Further, a two-terminal memory element can be arranged as a cross point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying 1/2 VW1 to the X-direction line and 1/2-VW1 to the Y-direction line), the memory element can switch to a low resistive state. When a second write voltage, VW2, is applied across the memory element (e.g., by applying 1/2 VW2 to the X-direction line and 1/2-VW2 to the Y-direction line), the memory element can switch to a high resistive state. Memory elements using electrolytic tunnel barriers and mixed valence conductive oxides can have VW1 opposite in polarity from VW2. Unlike FLASH memory, a write operation to the memory element(s) does not require a preceding erase operation (e.g., a block erase operation prior to a write operation).

The two-terminal memory elements can be positioned in a two-terminal cross-point memory array(s) and in some applications multiple layers of vertically stacked two-terminal cross-point memory array can be used to implement data storage. The circuitry (e.g., line drivers, address decoders, read and write voltage sources, sense amps, multiplexers, analog circuitry, and the like) for performing data operations (e.g., read and write operations) on the layer(s) of two-terminal cross-point memory array(s) can be fabricated front-end-of-the-line (FEOL) on a substrate, such as a silicon wafer, for example. The circuitry can be fabricated using microelectronics fabrication processes, such as a CMOS fabrication process, for example. Subsequently, after the FEOL portion of the processing is completed, the substrate can undergo back-end-of-the-line (BEOL) processing to grow the one or more layers of two-terminal cross-point memory array(s) directly on top of the substrate and its FEOL circuitry by using additional microelectronics fabrication processes configured for fabricating the one or more layers of two-terminal cross-point memory array(s). In some applications, at least some of the processing techniques used for the FEOL processing can be used in the BEOL processing.

In that the one or more layers of two-terminal cross-point memory array(s) are fabricated directly on top of the access circuitry, and optionally, circuitry used for other purposes, at least some of the circuitry can be positioned under the one or more layers of two-terminal cross-point memory array(s) and within the area (e.g., in a X-Y dimension) occupied by the one or more layers of two-terminal cross-point memory array(s). Accordingly, at least a portion of the circuitry can be positioned under and within a perimeter defined by the X and Y dimensions of the one or more layers of two-terminal cross-point memory array(s). U.S. Pat. No. 6,836,421, issued on Dec. 28, 2004, and having application Ser. No. 10/613,009, and titled "Line Drivers That Fit Within A Specified Line Pitch" is herein incorporated by reference in its entirety and for all purposes, and describes FEOL line drivers and other FEOL access circuitry that can be positioned under one or more layers of BEOL memory arrays. In some applications the FEOL circuitry can be positioned entirely under the area foot print of the one or more layers of BEOL memory arrays. In some applications, only a portion of the FEOL circuitry is positioned under the area foot print of the one or more layers of BEOL memory arrays and a remaining portion of the FEOL circuitry is positioned outside the area foot print.

Figure 2A:
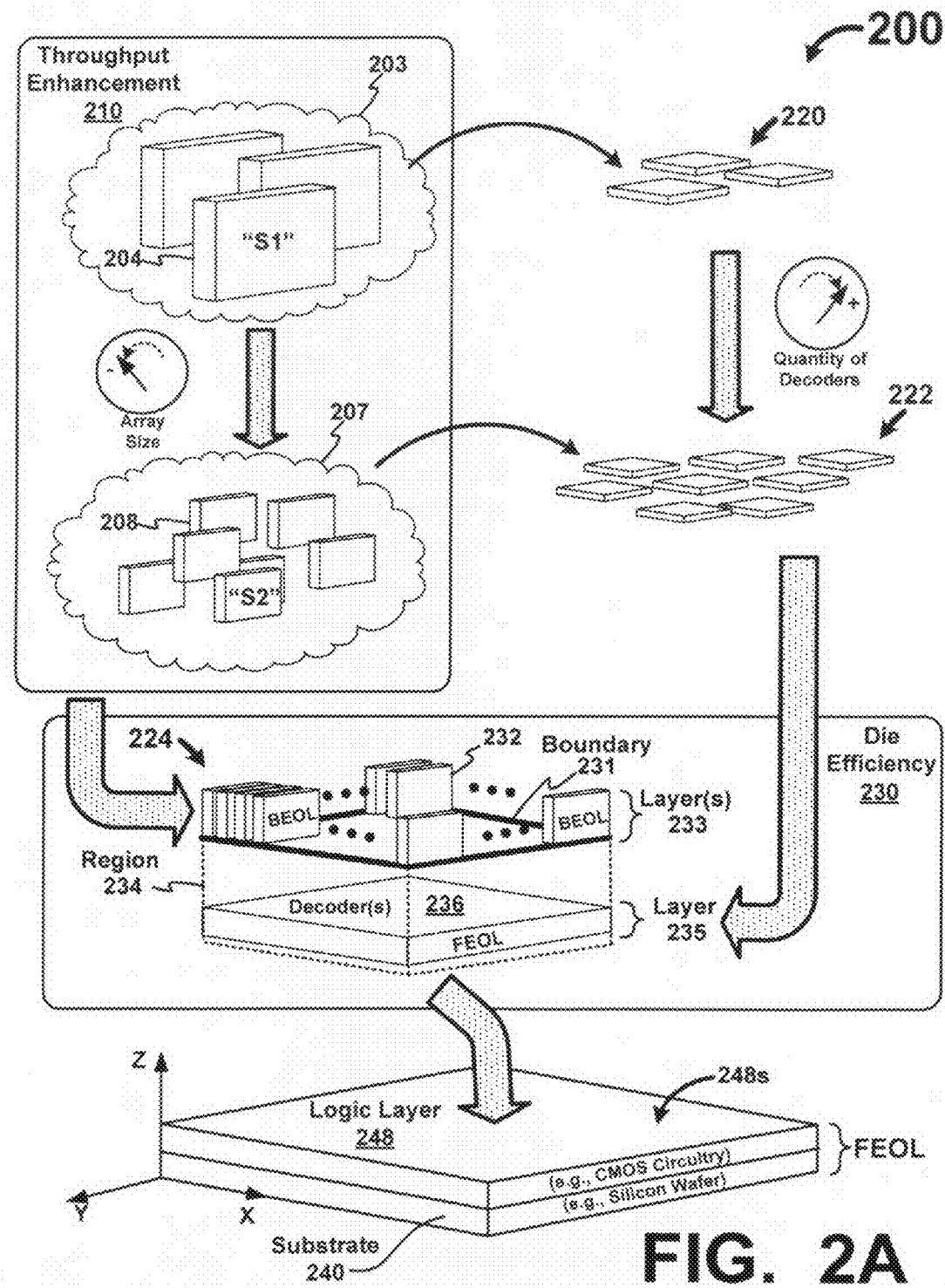
FIG. 2A depicts an example of one of the memory array architectures and processes to enhance throughput of memory devices in accordance with various embodiments.

FIG. 2A depicts an example of memory array architectures and/or processes to enhance throughput of memory devices in accordance with various embodiments. In this example, diagram 200 depicts a throughput enhancement functional block 210 and a die efficiency functional block 230, both of which are used to provide for a memory structure 224 formed in relation to a logic layer 248, which resides on or in a substrate 240. Memory structure 224 can include one or more layers of that are fabricated BEOL directly on top of and in contact with an upper surface 248s of FEOL logic layer 248. The upper surface 248s can be a portion of a FEOL inter-layer interconnect structure (not shown) that includes electrically conductive structures (e.g., vias, plugs, throughs, contacts, and the like) for electrically coupling the active circuitry in FEOL logic layer 248 with the BEOL memory layer(s) in memory structure 224. Herein, active circuitry includes but is not limited to circuitry for performing data operations (e.g., read, write, program, erase) on the BEOL memory. In some applications, the active circuitry can perform data operation functions and functions unrelated to data operations. The active circuitry can be in signal communication with an external host or system that communicates commands, data, address, and control signals, for example. According to some embodiments, throughput enhancement functional block 210 and/or its processes facilitate selection of a size of an array to determine one or more values of throughput (i.e., enhanced throughput) with respect to optimal die efficiency. As shown, a first quantity 203 of arrays 204 having a size, "S1," can be modified (e.g., reduced or scaled) to establish a second quantity 207 of arrays 208 having a reduced size, "S2." While first quantity 203 of arrays 204 and second quantity 207 of arrays 208 constitute the same amount of memory, note that second quantity 207 of arrays 208 can be greater than first quantity 203 of arrays 204 as the latter has a larger size, "S1," than reduced size, "S2." Arrays 208 of reduced size, S2, include fewer memory elements than arrays 204. The term "amount of memory" can refer to, at least in some embodiments, to a number of memory cells and/or memory states that can include single-level cell or multi-level cell implementations. Further, an increase in the quantity of arrays can be accompanied by an increased decoder circuitry ranging from the quantities and/or sizes of decoders 220 associated with arrays 204 to the quantities and/or sizes of decoders 222 associated with arrays 208. Die efficiency functional block 230 and/or its processes are configured to compensate for the impact of increased quantities and/or sizes of decoders upon die efficiency for memory architectures of the various embodiments. Thus, die efficiency functional block 230 is configured to manage or establish optimal die efficiency for enhanced values of throughput.

In view of the foregoing, the structures and/or functionalities of the memory array architecture can facilitate throughput enhancement as well as die efficiency preservation or optimization for reduced array sizes, according to various embodiments. In at least some embodiments, the memory architecture provides for relatively smaller (i.e., reduced) arrays, which, in turn, facilitates throughput enhancement as well as improved or faster write operations and/or read operations. A relatively large quantity of smaller arrays can provide at least a subset of the smaller arrays that can be accessed simultaneously to provide increased throughput compared to the throughput, for example, for a relatively smaller quantity of relatively large arrays formed in a common plane or layer of memory. Thus, enhanced throughput can be a function of a size (and/or collective sizes) for individual arrays or the aggregation thereof. In one embodiment, throughput enhancement functional block 210 can provide a quantity of relatively smaller arrays that is 16 to 64 (or more) times greater than memory architectures providing a relatively smaller number of relatively large arrays. In one example, quantity 207 of arrays 208 can be a quantity between 64 arrays and 256 arrays, or larger. Further, quantity 207 of arrays 208 can provide enhanced parallelism that can be one to two orders (or greater) in view of a relatively smaller number of relatively large arrays that are formed in a common plane. In some examples, the throughput value associated with memory structure 224 can range from 50 megabytes per second to 100 megabytes per second, or greater.

In various embodiments, die efficiency functional block 230 can operate to preserve and/or optimize die efficiency. In some examples, the quantities of decoders 222 can establish an aggregate decoder area composed of the collective areas of the quantities of decoders 222. In some embodiments, the quantity 207 of arrays 208 can be formed in an area that overlaps (e.g., partially or entirely) the aggregate decoder area, and, as such, the quantity 207 of arrays 208 can be formed over some or all of quantities of decoders 222 in different planes. Therefore, an increased quantity of decoders 222 can be disposed under arrays 208 and can vary, at least up to the area defined by arrays 208, for example, without contributing to increases in die size. Accordingly, the surface area of logic areas 248 (and the corresponding die size) can be independent of the size of arrays 208. In some embodiments, the surface area can be independent of a range of array sizes that correspond to a range of quantities of decoders 222 (or decoder sizes/areas) that are disposed coextensively within a region 234 being defined by boundary 231 encompassing arrays 232 and located between substrate 240 and arrays 232. Therefore, a throughput value can be modified (e.g., enhanced) independently of the die size as variations in the quantities of decoders 222 need not affect the dimensions of the memory device nor the ratio between the area of the arrays (e.g., collectively) and the die size. Thus, the die efficiency can be maintained relatively constant for a reduced size for arrays 232, according to one or more embodiments. Or, the die efficiency can be preserved closer to optimal (e.g., higher) values of die efficiency.

Further to FIG. 2A, die efficiency functional block 230 can facilitate the placement of decoders 222 having an aggregated decoder area 236 in a layer 235 (or plane) within region 234, which is under arrays 232. As shown, boundary 231 can be defined by the periphery of arrays 232 disposed in one or more layers 233 (or planes) oriented parallel to substrate 240. In some embodiments, aggregate decoder area 236 can be no greater an area determined by the dimensions of boundary 231. In some embodiments, arrays 232 are orthogonal arrays in which arrayed memory elements for a subset of X-lines (or word lines) and a group of Y-line portions (or local bit lines) are disposed (e.g., in a Z-Y plane) perpendicular to substrate 240 (e.g., an X-Y plane).

In some embodiments, a non-volatile memory device can be formed as a structure configured to enhance throughput in an exemplary flow as follows. First, region 234 can be identified relative to substrate 240. Subsequently, a quantity of decoders 222 can be formed as in region 234, where the quantity of decoders 222 is a function of a size for each of a quantity of arrays 232. The formed quantity of decoders 222 establishes aggregate decoder area 236. Next, the quantity of arrays 232 can be formed substantially over the quantity of decoders 222. In some cases, arrays 232 are orthogonal arrays being sized to provide for an enhanced throughput value. In specific embodiments, the flow can include determining a range of areas in which a value of die efficiency for the non-volatile memory device is independent of the quantity of decoders 222. For example, the range of areas includes areas that are less than or equal to another area determined by boundary 231. Within this range of areas, the values of die efficiency can be relatively constant. In other examples, the range of areas can also include areas that extend beyond the area determined by boundary 231 and preserves die efficiency at values greater than otherwise might be the case. Next, a range of throughput values associated with the value of die efficiency can be determined, one of which can be selected as an enhance throughput value. In one embodiment, the flow can include forming peripheral circuit elements in region 234 to increase die efficiency for the non-volatile memory device, where the peripheral circuit elements can include pass gates, control lines, and other equivalent memory-related circuitry. In at least some embodiments, a cross point memory array is formed over region 234 by fabricating X-lines and Y-lines. Note that the fabrication of Y-lines can include fabricating groups of Y-line portions (i.e., groups of local bit lines), each Y-line portion (i.e., each local bit line) being arranged electrically in parallel with each other within the group. Memory elements in the orthogonal arrays are formed between a subset of the X-lines and a group of the Y-line portions.

As used herein, the term "orthogonal array" can refer, at least in some embodiments, to an array of memory elements disposed in a plane perpendicular to a plane that is parallel to a substrate upon which a logic layer is formed. The memory elements of an orthogonal array can be disposed between an X-line and a local bit line, where the local bit line is one of a group of local bit lines stacked upon each other in multiple layers of memory. So while a local bit line can be disposed parallel to the substrate, the group of local bit lines can be stacked in a plane that is perpendicular to substrate. As used herein, the term "surface area" can be used interchangeably, at least in some embodiments, with the term "die size." As used herein, the term "die efficiency" can be used, at least in some embodiments, to refer to a ratio between an area occupied by a number of memory cells (and/or arrays thereof) and a die area or size. In some embodiments, die efficiency can be relatively constant as throughput is enhanced, with die size being relatively independent of additional quantities of decoders (or a specific range of additional quantities of decoders). As used herein, the term "size" can be used, at least in some embodiments, to refer to the physical dimensions of a circuit or circuit element that establish a die size, a quantity of memory elements, or the like. As used herein, the term "quantity of decoders" can be used, at least in some embodiments, to refer to the number of discrete units of decoders and/or to the physical dimensions (individually or in combination)—including area—of the decoders. As used herein, the term "throughput" can be used, at least in some embodiments, to refer to the rate of units of data being communicated or exchanged with memory arrays per unit time, and, as such, can be used to describe throughput as a "read throughput value" during read operations and as a "write throughput value" during write operations.

Figure 2B:
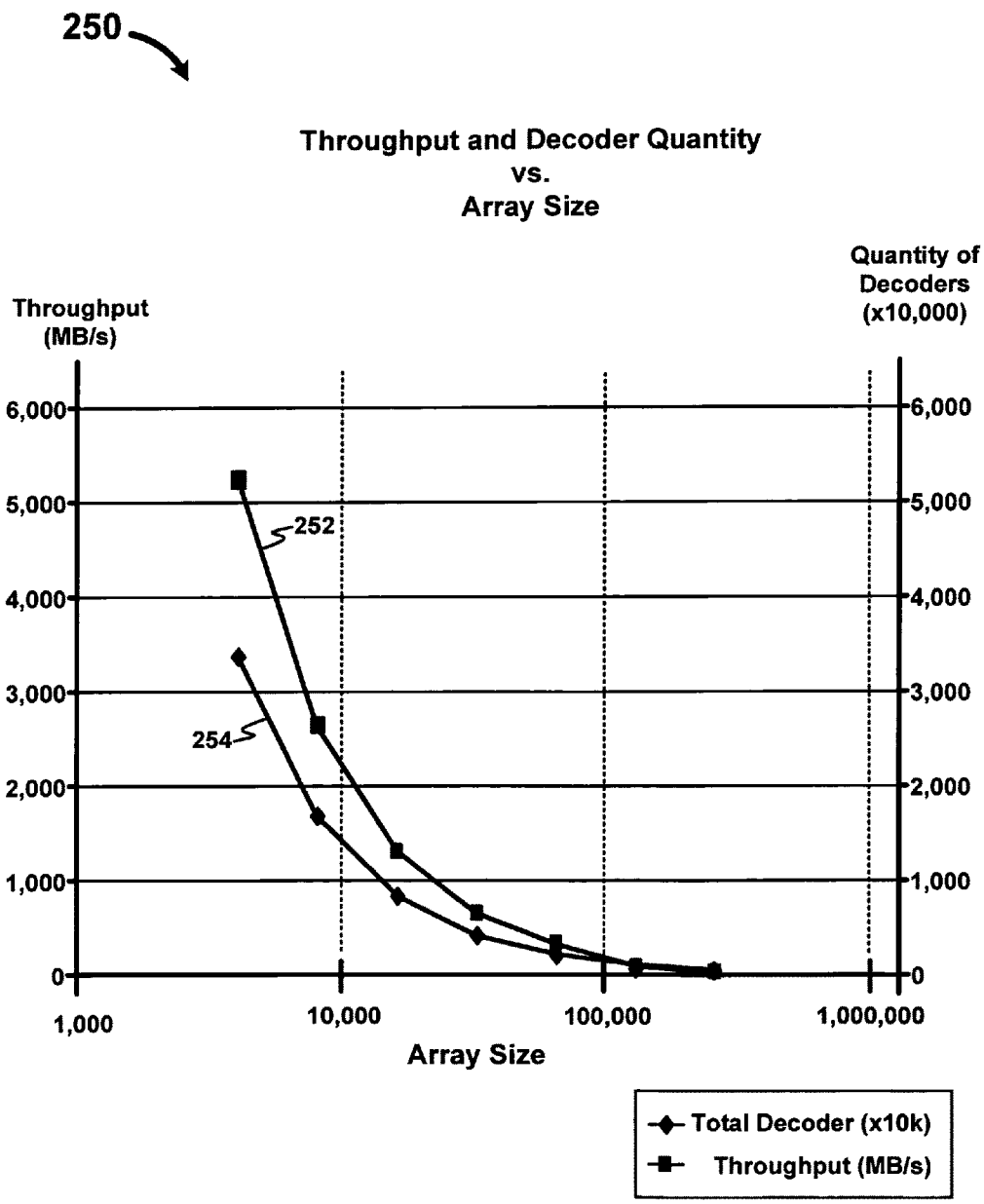
FIG. 2B is a diagram depicting an example of relationships between a size of an array and both the throughput for a memory architecture and the quantities of decoders in accordance with various embodiments.

FIG. 2B is a diagram 250 depicting an example of relationships between a size of an array and both the throughput for a memory architecture and the quantities of decoders in accordance with various embodiments of the invention. Relationship 252 depicts the enhancement of throughput in units of megabytes per second as an array size is reduced from about 100,000 to below 10,000 memory cells/states. Relationship 254 depicts a corresponding increase in the quantities of decoders for an equivalent array size reduction from about 100,000 to below 10,000 memory cells/states. As indicated above, memory architectures of the various embodiments are configured to compensate for the increases in the quantities of decoders by placing them under the orthogonal arrays.

Figure 2C:
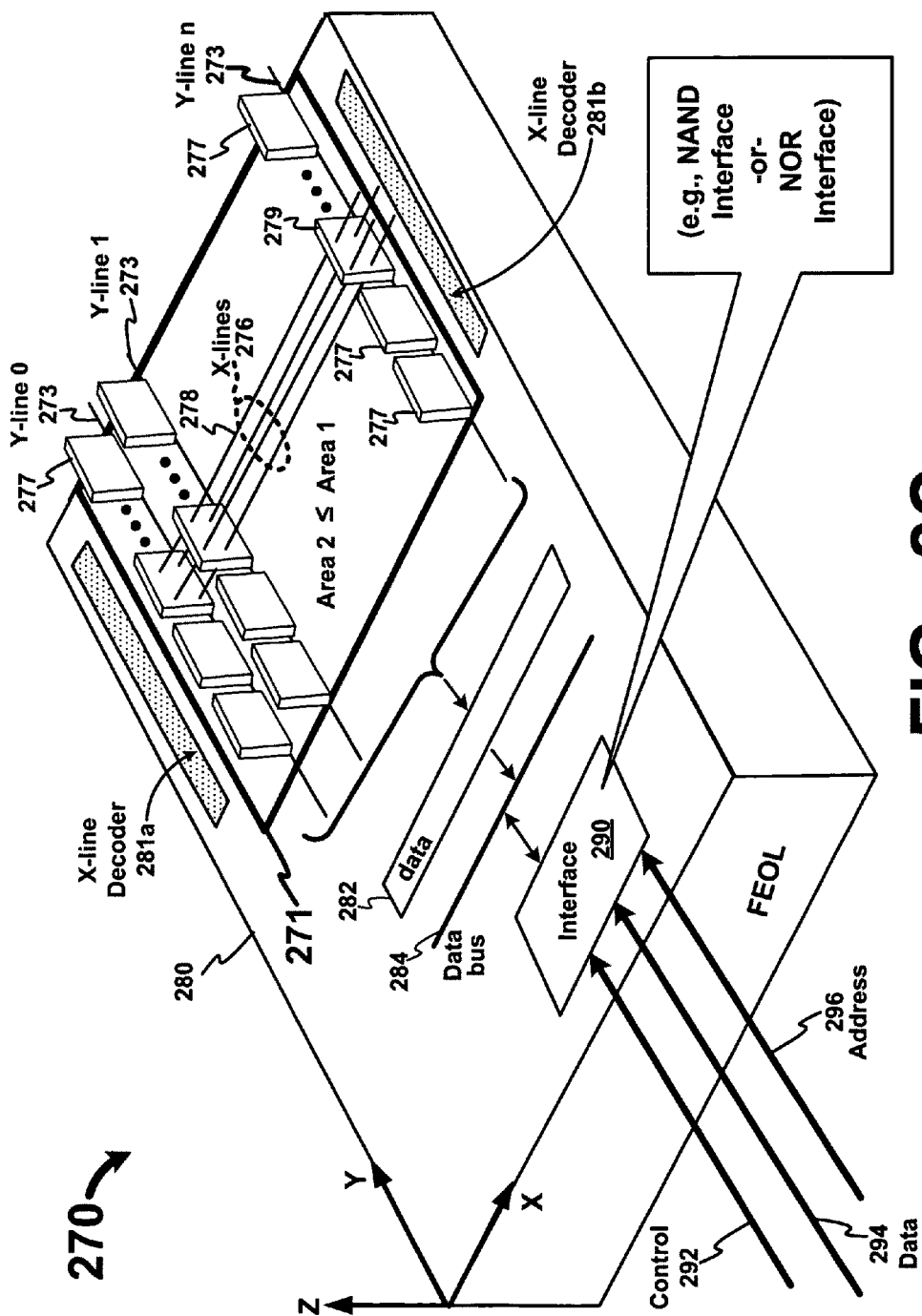
FIG. 2C is a perspective view depicting another example of memory array architectures configured to enhance throughput of memory devices, according to various embodiments.

FIG. 2C is a perspective view for another example of memory array architectures configured to enhance throughput of memory devices, according to various embodiments. Diagram 270 depicts a memory device 280 including orthogonal arrays 277 and 279 associated with an area ("Area 1") bounded by boundary 271. In some embodiments, arrays 277 can be disposed in a cross point memory array that includes X-lines and Y-lines, of which at least one Y-line 273 is coupled to an orthogonal array 277. Orthogonal arrays 277 and 279 each include a group of the local bit lines (not shown), each of the local bit lines being arranged in parallel with other local bit lines. Further, the cross point memory array can include a subset of the memory elements being disposed between a subset 276 of the X-lines 278 and a group 279 of the local bit lines. Note that a decoder area ("Area 2") is less than or equal to "Area 1" (Area 2≤Area 1) and is disposed below orthogonal arrays 277 and 279. In some embodiments, X-line decoder 281a for even word lines and X-line decoder 281b for odd word lines can be disposed adjacent and/or under arrays 277. In the example shown, data 282 is read from a subset of orthogonal arrays 277 at a throughput value that places the data onto data bus 284.

Memory device 280 also includes an interface 290 for exchanging data external to memory device 280 by using control signals via path ("control") 292, data signals via path ("data") 294, and address signals via path ("address") 296. Thus, interface 290 includes ports to receive control signals via path 292 (e.g., a write enable signal, a chip select signal, etc.), address signals via path 296, and data signals via path 294 (e.g., write and/or read data signals). Interface 290 can be configured as either a DRAM-type interface, a NOR-type interface, or a NAND-type interface. In embodiments in which interface 290 is a NAND-type interface, data signals via path 294 and address signals via path 296 are multiplexed onto a common I/O bus (not shown). Accordingly, orthogonal arrays 277 and 279 can be used to emulate NAND-based memory devices, such as NAND Flash memories. For NAND-based memory device emulation, all of Y lines 273 (or fewer) can be accessed concurrently to read data 282 in a block-wise or page-wise fashion to emulate, for example, a NAND Flash memory device. The active circuitry for performing data operations on the one or more layers of memory and the random access (RAM) configuration of the non-volatile two-terminal memory element and two-terminal cross-point arrays allows for emulation of one or more memory types or combinations of memory types such as the aforementioned DRAM, NOR Flash, and NAND Flash, as well as SRAM, ROM. For DRAM emulation (e.g., for a DRAM-type interface), the refresh operations (e.g., RAS and CAS) on conventional DRAM memory devices can be eliminated or can be mimicked to serve the needs of a memory controller, system, or host device. Similarly, conventional Flash memory requires a block erase operation prior to a write operation. For emulation of Flash memories and/or for the NAND-type interface or NOR-type interface, the precedent block erase operation need not be implemented, resulting in reduced write latency incurred by having to perform the conventional block erase operation. Moreover, Flash OS software can be modified to implement a write operation without the block erase operation. Accordingly, the block erase operation is optional and can be implemented or not implemented as a design choice or based on system requirements. In some applications, even though the block erase operation is not required, the active circuitry can be configured to implement the block erase operation (e.g., for backward compatibility with legacy systems) or to generate handshakes or other signals to indicate the block erase operation was executed. The execution of the block erase operation can actually occur or it can be faked (e.g., via handshakes or the like) to reduce latency or to comply with the expected response from a system.

In a specific embodiment, memory device can include 128 orthogonal arrays 277 and 279, each orthogonal array having 4 k Y-lines 273 and 16k X-lines 278. In various embodiments, each memory element can be configured to store either a single bit (e.g., as a single-bit cell, or "SLC") or multiple bits (e.g., as a multiple-bit cell, or "MLC"). During write operations, 4,000 bits (or more) can be programmed in parallel, whereby write throughput values can range from 40 MB/s to 60 MB/s, or greater. During read operations, 64 kbits (for SLC-based memory elements) can be read in parallel, whereby read throughput value can range from 80 MB/s to 100 MB/s, or greater. Various alternative embodiments, however, are not limited to these parameters, which are provided to illustrate the capabilities of a specific implementation.

Figure 3:
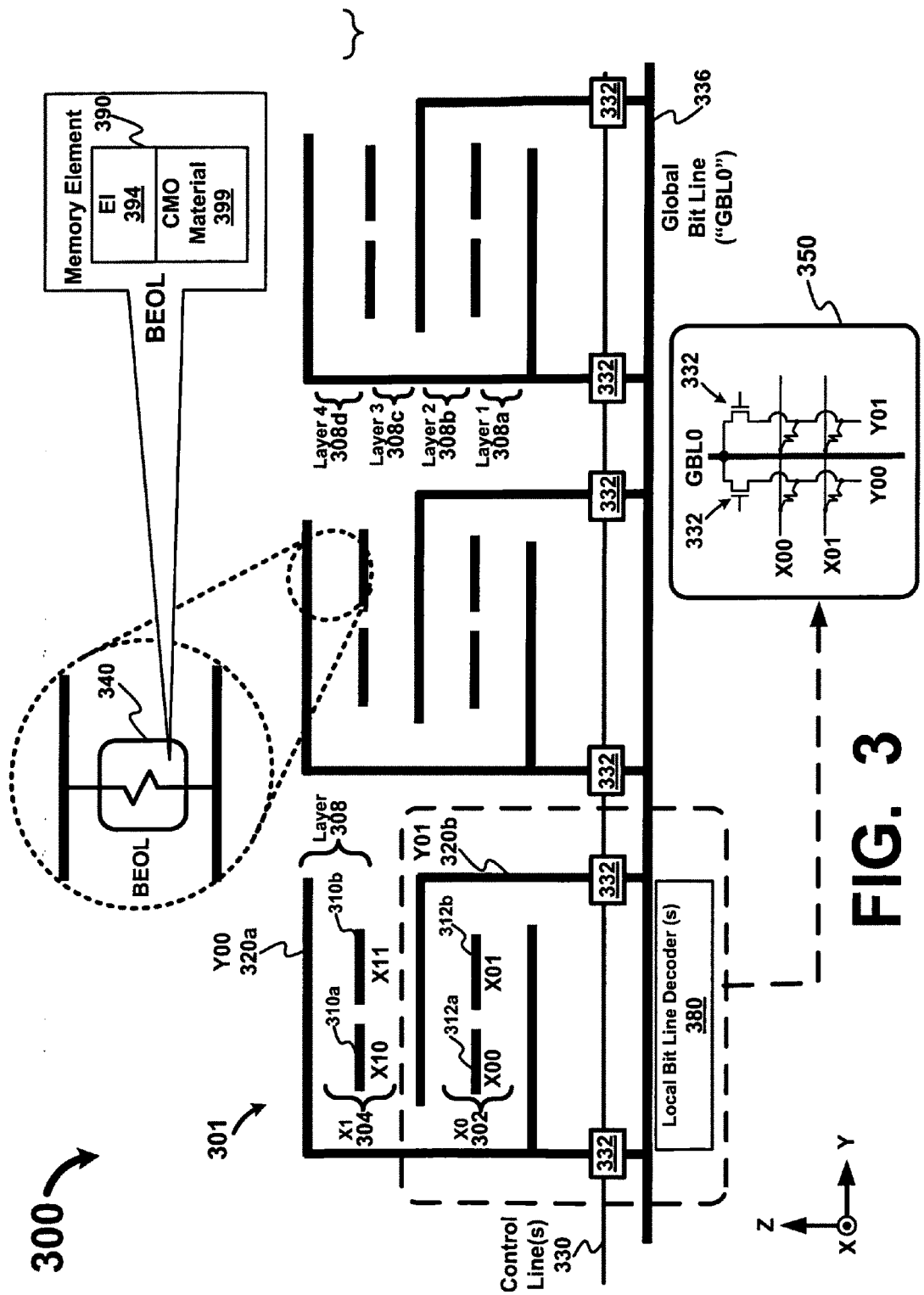
FIG. 3 is a diagram depicting an example of a memory array architecture for portions of a Y-line in accordance with embodiments.

FIG. 3 is a diagram depicting an example of a memory array architecture for portions of a Y-line in accordance with embodiments. Diagram 300 depicts arrays 301 each including a Y-line as a global bit line ("GBL0") 336 (or a portion thereof), a number of X-lines 310 and 312 arranged in one orientation, and a number of local bit lines depicted as Y-line portions 320, which are arranged in another orientation. In particular, global bit line 336 and X-lines 310 and 312 lie in planes parallel to an X-Y plane, and Y-line portions 320 lie in a plane parallel to a Z-Y plane (i.e., perpendicular to the X-Y plane). As shown, Y-line portions 320 extend from global bit line 336 into two or more layers 308 of memory and are coupled via control gates 332 to global bit line 336. In the example shown, array 301 include four layers 308 including from layer ("layer 1") 308a to layer ("layer 4") 308d, whereby each layer is a layer of memory. One or more control lines 330 are coupled to control gates 332 to provide activation and deactivation signals. In a specific embodiment, local bit line decoders 380 are disposed below arrays 301. Optionally, local bit line decoders 380 can also generate control signals to apply to control line(s) 330.

In the example shown, Y-line portion 320 is associated with at least two subsets of X-lines. For example, Y-line portion ("Y00") 320a is arranged to couple via memory elements 340 to subset of X-lines ("X0") 302 and subset of X-lines ("X1") 304. Subset of X-lines ("X1") 304 includes X-line ("X10") 310a, X-line ("X11") 310b, and optional others not shown. Subset of X-lines ("X0") 302 includes X-line ("X00") 312a, X-line ("X01") 312b, and optional others not shown. Similarly, Y-line portion ("Y01") 320b is arranged to couple via memory elements 340 to subset of X-lines ("X0") 302 and subset of X-lines ("X1") 304. A representation 350 depicts a schematic for subset of X-lines 302 coupled via resistive memory elements to Y-line portions ("Y00") 320a and ("Y01") 320b. In some embodiments, one or more of control lines 330, control gates 332, and global bit line 336 are formed below an array including array 301, and, optionally, in a logical layer formed on a substrate. As used herein, the term "Y-line portion" can be used interchangeably with the term "local bit line," according to some embodiments. In some embodiments, periphery circuitry, such as one or more of control lines 330, control gates 332, global bit line 336, and decoder 380, can be formed in a logic layer on a substrate (e.g., a semiconductor substrate such as a Silicon—Si wafer) using complementary metal-oxide-semiconductor ("CMOS") fabrication processes, including relatively low voltage CMOS fabrications processes (e.g., to fabricate low voltage CMOS fabrication devices operable with gate voltages of 1.2 volts or less). One example of a suitable CMOS fabrication technology is 0.13 um technology.

In some embodiments, a memory element described in FIG. 3 can be implemented as a resistive memory element 390, which includes a structure 394 implementing an electrolytic insulator ("EI") and a structure 399 based on at least one layer of a conductive oxide material, such as a conductive metal oxide-based ("CMO-based") material, for example. Memory element 390 further can include two terminals (not shown). In various embodiments, the conductive oxide material in structure 399 can include a material selected from one or more the following: a perovskite, $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites, and equivalent materials. In various embodiments, electrolytic insulator 394 can include a material for implementing a tunnel barrier layer, the material being selected from one or more of the following: rare earth oxides, rare earth metal oxides, yttria-stabilized zirconium (YSZ), zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$), and equivalent materials. The electrolytic insulator 394 includes a thickness that is less than approximately 50 Å. For example, the electrolytic insulator 394 can have a thickness in a range from about 10 Å to about 30 ÅA.

Figure 4A:
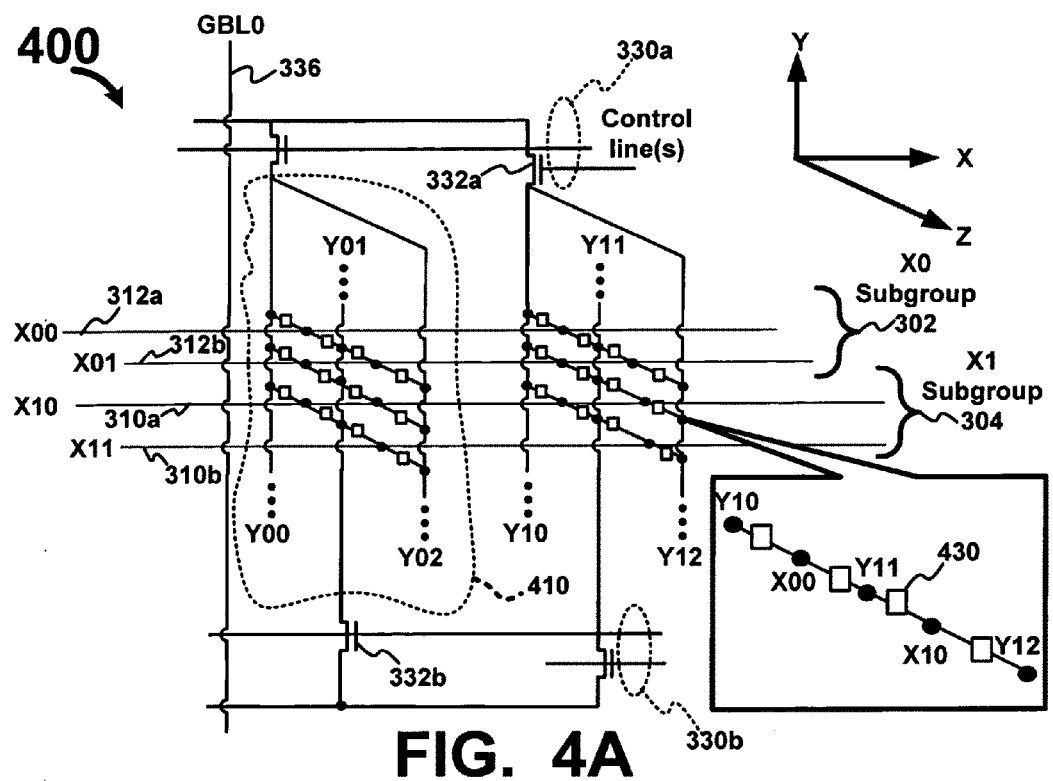
FIGS. 4A and 4B depict perspective views of a memory array architecture including arrays based on bit line portions (or local bit lines), according to various embodiments.
Figure 4B:
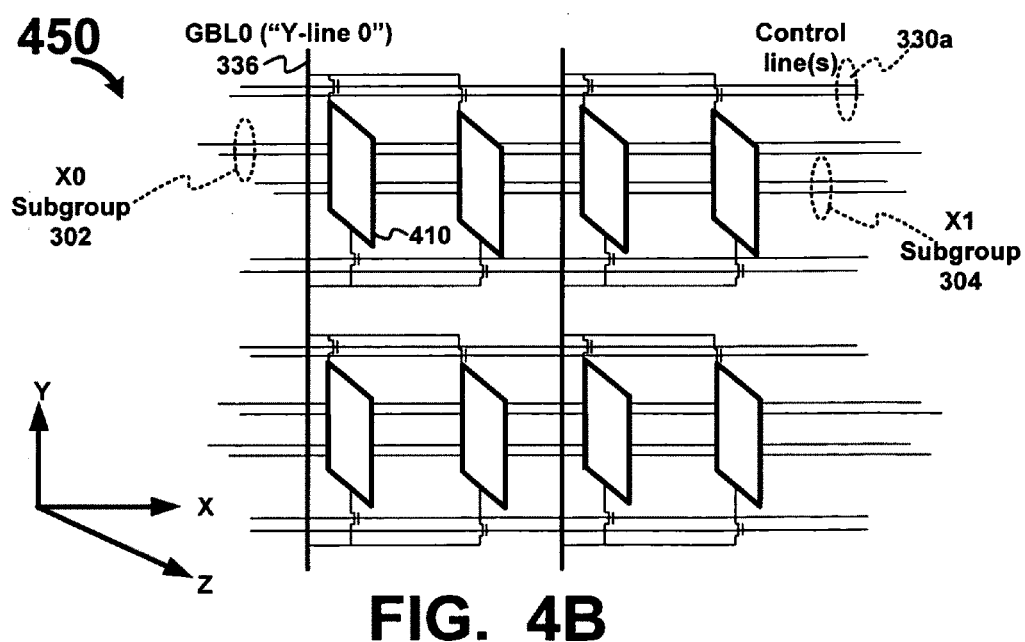

FIGS. 4A and 4B illustrate perspective views of a memory array architecture including orthogonal arrays based on bit line portions, according to various embodiments. Diagram 400 of FIG. 4A depicts word line subset ("X0 Subgroup") 302 and word line subset ("X1 Subgroup") 304 of FIG. 3. Word line subset 302 includes X-line ("X00") 312a and X-line ("X01") 312b formed below X-line ("X10") 310a and X-line ("X11") 310b of word line subset 304. In particular, word line subset 302 is formed below word line subset 304 relative to a distance along the Z-axis with respect to a substrate in an X-Y plane. Further, control lines 330a are configured to gate even-numbered local bit lines (e.g., Y00, Y02, Y10, and Y12) via gates 332a onto global bit line 335, whereas control lines 330b are configured to gate odd-numbered local bit lines (e.g., Y01 and Y11) via gates 332b onto global bit line 335. As shown, a memory element 430 is disposed at the intersections of a Y-line portion and either an X-line 310 or X-line 312. Diagram 450 of FIG. 4B depicts a larger portion of a memory architecture including multiple instances of orthogonal array 410 of FIG. 4A. In the examples shown, orthogonal array 410 includes layers of memory stacked in relation to bit line portions formed perpendicular to the word lines.

Figure 5:
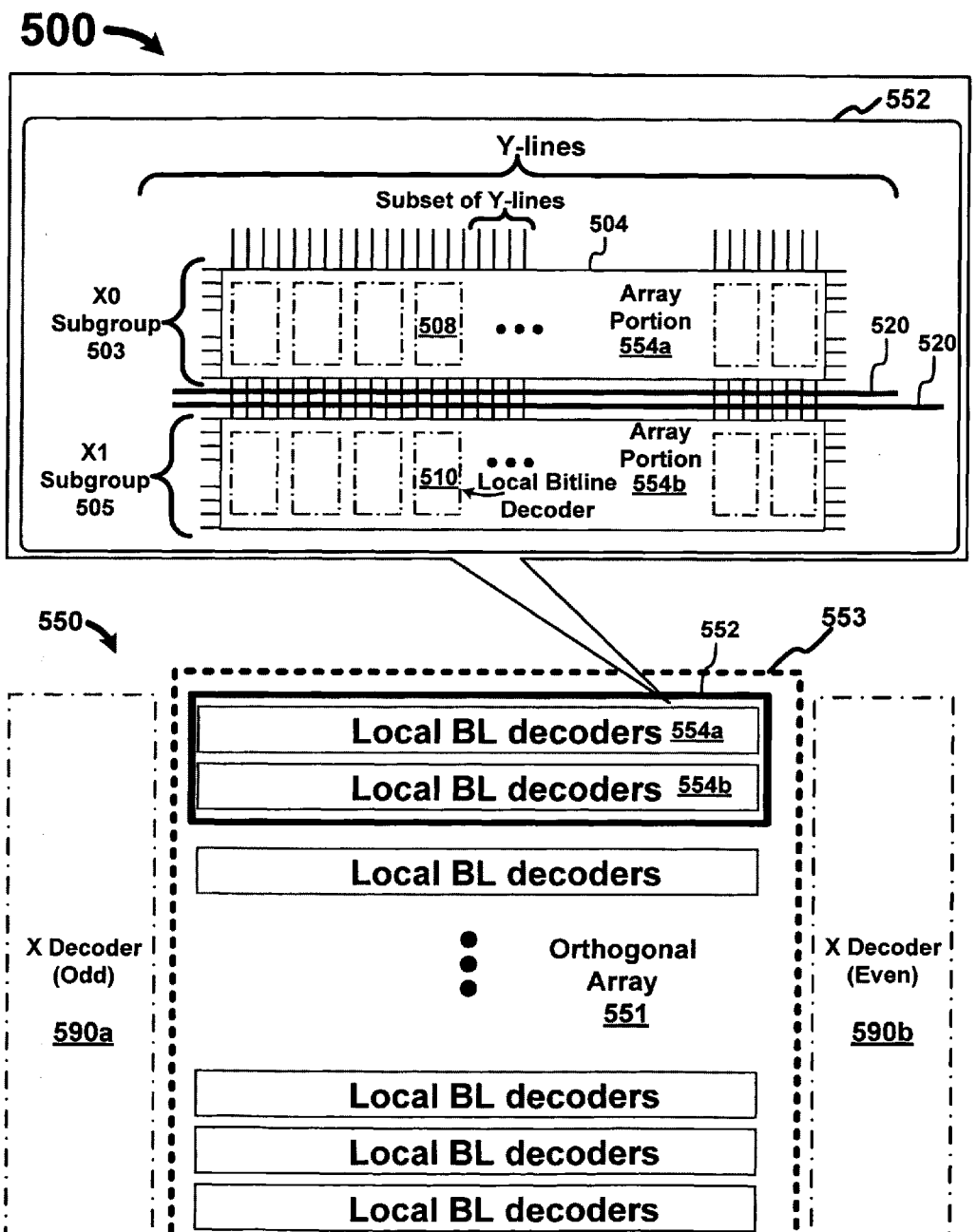
FIG. 5 depicts a diagram of an array structure, according to at least some embodiments.
Figure 5A:
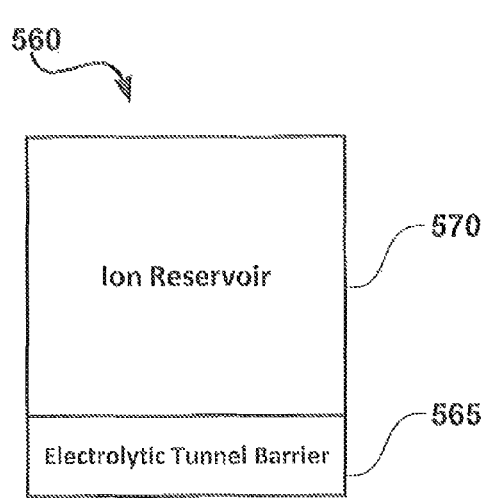
FIG. 5A depicts a block diagram representing the basic components of one embodiment of a memory element.
Figure 5B:
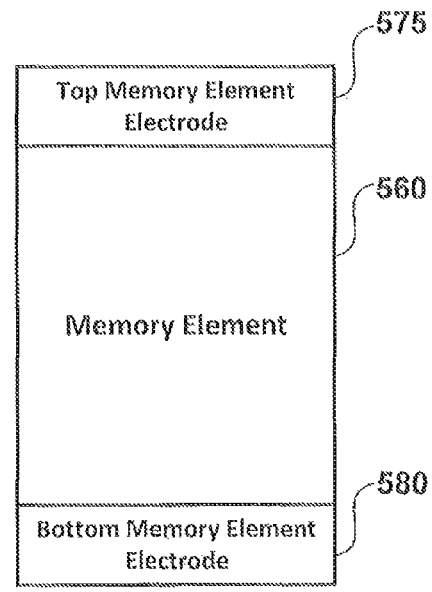
FIG. 5B depicts a block diagram of the memory element of FIG. 5A in a two-terminal memory cell.
Figure 5C:
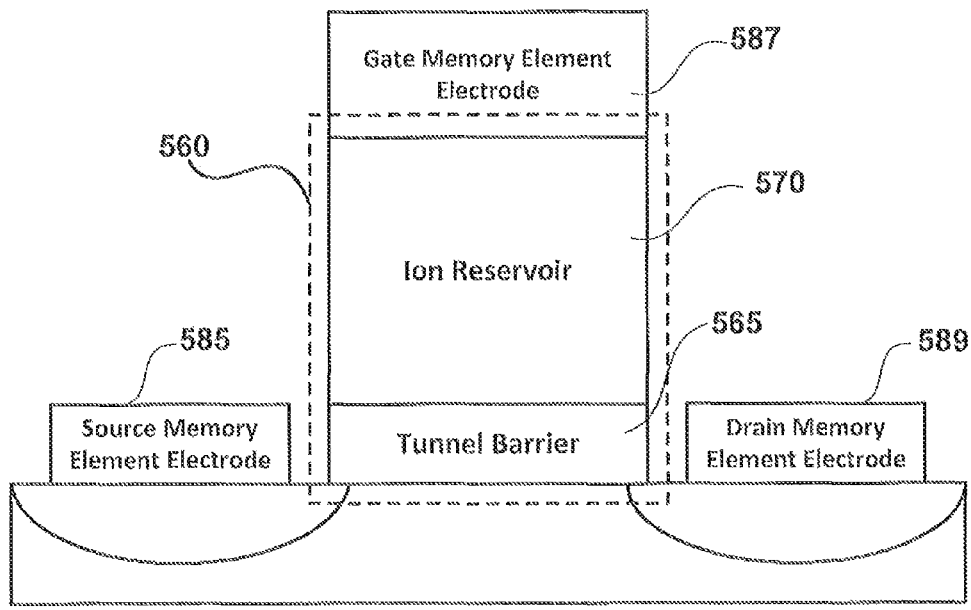
FIG. 5C depicts a block diagram of the memory element of FIG. 5A in a three-terminal memory cell.

FIG. 5 is a diagram of an array structure, according to at least some embodiments of the invention. In the example shown in diagram 500, FIG. 5 depicts a layout or plan view of array structure portion 552 includes array portion 554a and array portion 556b. Array portion 554a and array portion 554b include an X-line subgroup ("X0") 503 and an X-line subgroup ("X1") 505, respectively, each having a number of X-lines that span at least over a number of Y-lines. Further, array portion 554a and array portion 554b can be formed over local bit line decoders 508 and 510, respectively, to control bit line portions that constitute a subset of Y-lines, array portions 554a and 554b including one or more layers of memory. Or, local bit line decoders 508 and 510 can be formed within a periphery 504 (or boundary) of any of array portions 554a or 554b, according to some embodiments. In particular, local bit line decoders 508 and 510 can be configured to decode at least a portion of an address to access one or more memory elements in a subset of memory elements for a Y-line portion, and can be disposed under the subset of the X-lines. In some embodiments, local bit line decoders 508 and 510 can be configured to access one or more memory elements along an X-line substantially simultaneously to perform, for example, an erase or program operation on a group of memory elements (e.g., a byte erase operation). Or, local bit line decoders 508 and 510 can be configured to access a bit line portion from all of the global bit lines along an X-line substantially simultaneously to perform, for example, a page erase operation or a block erase operation, where blocks include a number of pages.

Control lines 520 are configured to convey control signals to activate or deactivate local pass gates. Diagram 550 depicts a periphery 553 of orthogonal array 551 in which array structure portion 552 is disposed. Thus, local bit line ("BL") decoders 508 and 510 are disposed under array portions 554a and 554b as part of orthogonal array 551. In one embodiment, an X decoder 590a and an X decoder 590b are located beyond the array block footprint or periphery 553. In one embodiment, X-line subgroup ("X0") 503 and an X-line subgroup ("X1") 505 each includes 64 X-lines that span across multiple global bit lines, such as 4 k Y-lines (or 4 k global bit lines). Thus, the length of an X-line can include 4 k memory elements. The length of a bit line portion can include 128 memory elements per layer, and a length of a global bit line can be 16 k cell within 256 groups of bit line portions. In orthogonal array 551, there can be 16 k X-lines over the subsets of X-lines.

Figure 6:
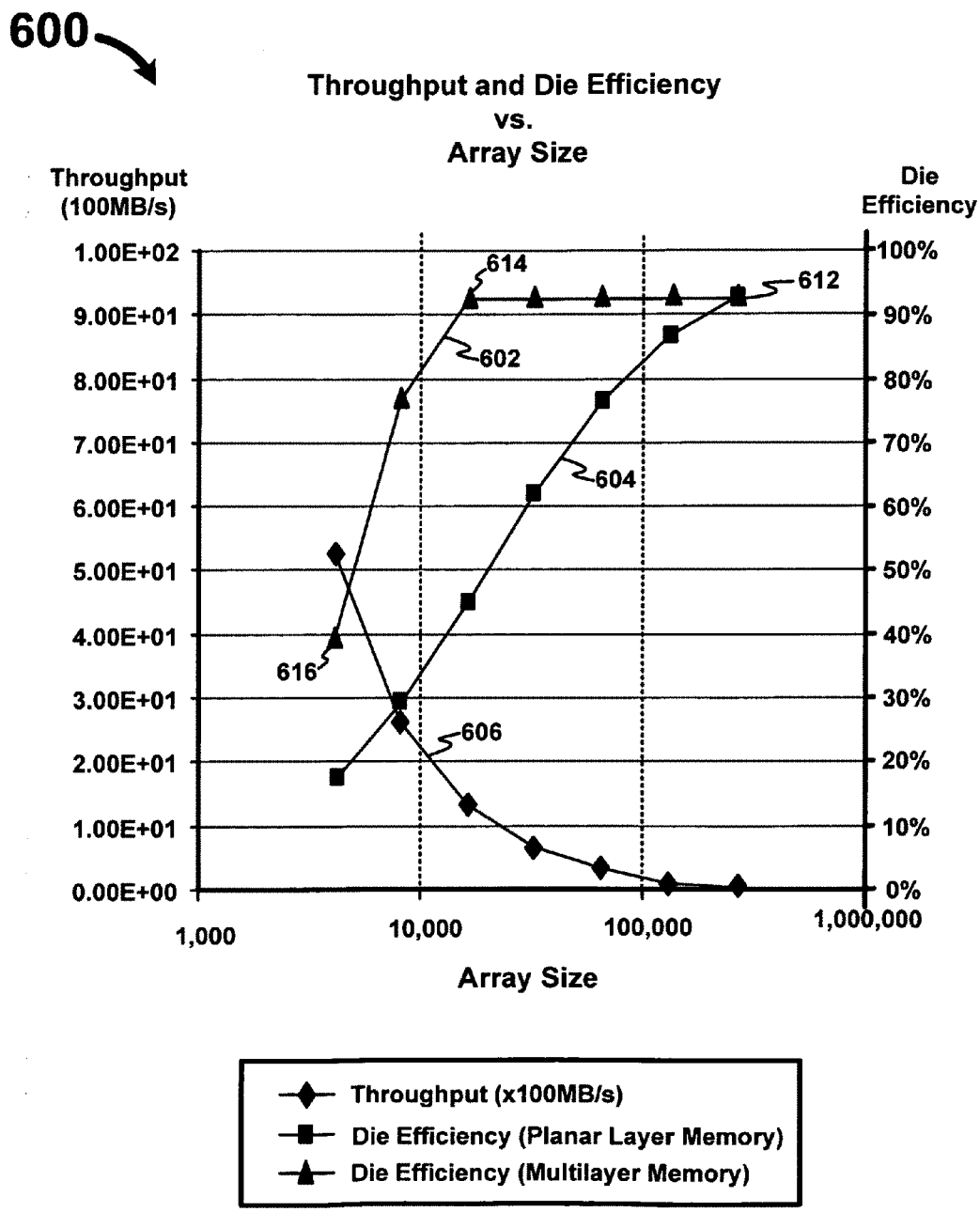
FIG. 6 is a diagram depicting examples of relationships for throughput and die efficiency relative to a size of an array in accordance with various embodiments.

FIG. 6 is a diagram 600 depicting examples of relationships for throughput and die efficiency relative to a size of an array in accordance with various embodiments. Relationship 602 depicts higher values of die efficiency as a function of array size for multilayered memories relative to relationship 604, which depicts comparatively lower values of die efficiency for single (i.e., planar) arrangements of memory. The enhanced throughput can be expressed in units of megabytes per second. Relationship 606 depicts the enhancement of throughput in units of megabytes per second as an array size is reduced from about 100,000 to below 10,000 memory cells/states. Thus, a comparison of relationship 602 and 604 indicates that memory architectures of the various embodiments can compensate for the increases in the quantities of decoders by placing them under the orthogonal arrays to preserve or optimize die efficiency and die size. For example, a range of array sizes from about 140,000 to about 15,000, die efficiency can be maintained relatively constant for any reduced array size coinciding with relationship 602 between points 612 and 614. Between points 612 to 616 is a range of array sizes from about 15,000 to about 5,000 that can preserve or more closely retain optimal (e.g., higher) values of die efficiency compared to relationship 604.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit comprising:
a front-end-of-the-line (FEOL) logic layer including active circuitry fabricated FEOL on a substrate; and
arrays of memory elements, each memory element coupled between back-end-of-the-line (BEOL) array lines that electrically couple the memory elements with the active circuitry;
wherein the memory elements are fabricated in at least one BEOL layer directly above the FEOL logic layer within a memory element region having a boundary defined by a periphery of the memory elements and positioned in a plane parallel to the substrate and the BEOL array lines;
wherein the active circuitry includes a plurality of FEOL array line decoders disposed in the FEOL logic layer within a decoder region defined by a periphery of the plurality of the FEOL array line decoders located between the substrate and the memory elements;

wherein a quantity of the plurality of FEOL array line decoders corresponds to a quantity of memory elements in the memory arrays of the memory elements configured to provide a throughput value;

wherein the memory element region and the decoder region substantially overlap; and wherein the decoder region is less than or equal to the memory element region.

2. The integrated circuit of claim 1, wherein the throughput value is configured to vary as a function of the quantity of memory elements independent of a die size for the substrate.

3. The integrated circuit of claim 1, further comprising:
a plurality of BEOL arrays constituting an amount of memory;
wherein each BEOL array includes a size configured to provide for the throughput value.

4. The integrated circuit of claim 3, wherein the plurality of FEOL array line decoders are configured to access a subset of the plurality of BEOL arrays concurrently to communicate data at a first throughput value.

5. The integrated circuit of claim 4,
wherein the first throughput value is a function of the size of each of the plurality of BEOL arrays; and
wherein a surface area of the substrate is independent of the size of each of the plurality of BEOL arrays.

6. The integrated circuit of claim 4,
wherein the first throughput value is greater than a second throughput value; and
wherein the plurality of FEOL array line decoders and the memory elements provide the second throughput value;
wherein the memory elements are formed in a common BEOL plane; and
wherein the decoder region is equivalent to the memory element region.

7. The integrated circuit of claim 4,
wherein the plurality of BEOL arrays each comprise a number of memory elements configured to determine a decoder area for a corresponding FEOL array line decoder; and
wherein an aggregate FEOL decoder area the decoder region including the decoder areas for the plurality of FEOL array line decoders is no greater than the memory element region.

8. The integrated circuit of claim 1, wherein the memory elements are positioned in at least one layer of a BEOL two-terminal cross-point memory array that is fabricated BEOL, is positioned over the FEOL logic layer, and is in contact with the substrate.

9. The integrated circuit of claim 1, further comprising:
a BEOL cross point memory array including:
X-lines;
Y-lines, of which at least one Y-line is coupled with a group of the X lines; and
a subset of the memory elements being disposed between a subset of the X-lines and a subset of the Y lines.

10. The integrated circuit of claim 9, wherein the group of the subset of the memory elements constitute a BEOL array.

11. The integrated circuit of claim 1, wherein each memory element has exactly two terminals and includes a programmable resistivity to store a state as a value of resistance.

12. The integrated circuit of claim 1, wherein the active circuitry includes a FEOL interface configured as either a DRAM interface, a NAND interface, or a NOR interface.

13. The integrated circuit of claim 1, wherein the throughput value is measured in megabytes per second or greater.

14. The integrated circuit of claim 1, wherein the substrate comprises a silicon wafer or a silicon die.

15. The integrated circuit of claim 1, wherein the substrate comprises a semiconductor substrate.

16. The integrated circuit claim 1, wherein each memory element includes a non-ohmic characteristics that exhibits a very high resistance regime for a first range of voltages and a very low resistance regime for voltages above and below the first range.

17. The integrated circuit of claim 1, wherein each memory element includes a tunnel barrier and an ion reservoir electrically in series with each other.

18. The integrated circuit of claim 17, wherein the ion reservoir includes mobile oxygen ions.

19. The integrated circuit of claim 18, wherein the tunnel barrier is permeable to the mobile oxygen ions during write operations on the memory element.

20. A device comprising:
active circuitry including multiple array line decoders fabricated front-end-of-the-line (FEOL) on a substrate; and
multiple memory arrays including memory elements, each memory element coupled between back-end-of-the-line (BEOL) array lines associated with corresponding memory arrays that electrically couple the memory elements with the array line decoders;
wherein the memory elements fabricated BEOL directly above the array line decoders within a memory region having a boundary defined by a periphery of the memory elements and positioned in a plane parallel to the substrate;
wherein the multiple array line decoders are disposed within a decoder region defined by a periphery of the plurality of the FEOL array line decoders located coextensive with the boundary;
wherein the multiple memory arrays are each addressable by different array line decoders;
wherein the memory region and the decoder region substantially overlap; and
wherein the decoder region is less than or equal to the memory element region.

21. The device of claim 20, wherein the array line decoders are configured to access a subset of the memory arrays concurrently to communicate data at a throughput value for the device.

22. The device of claim 21, wherein the throughput value for the device is based on an arrangement of the memory elements into the memory arrays.

23. The device of claim 21, wherein the throughput value for the device is based on a number of array line decoders disposed in the decoder region located coextensive with the boundary.

24. The device of claim 21, wherein the throughput value for the device is independent of a die size for the substrate.

25. The device of claim 21, wherein a surface area of the substrate is independent of a size of the memory arrays.

26. The device of claim 20, wherein at least one memory element includes a tunnel barrier and an ion reservoir electrically in series with each other.

* * * * *